United States Patent
Klausmann et al.

(10) Patent No.: US 7,351,979 B2
(45) Date of Patent: Apr. 1, 2008

(54) PLANAR IMAGE DETECTOR

(75) Inventors: Hagen Klausmann, Germering (DE); Georg Wittmann, Herzogenaurach (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 11/611,172

(22) Filed: Dec. 15, 2006

(65) Prior Publication Data

US 2007/0145283 A1 Jun. 28, 2007

(30) Foreign Application Priority Data

Dec. 16, 2005 (DE) .................... 10 2005 060 794

(51) Int. Cl.
*G01T 1/20* (2006.01)
*G01T 1/24* (2006.01)

(52) U.S. Cl. ............... 250/370.11; 250/370.01

(58) Field of Classification Search ............... 250/370.01–370.15, 378, 363.01–363.1, 250/318, 208.1–208.6; 257/153, 157, 107, 257/175, 176, 202, 239, 250, 260, 267, 282, 257/285, 300, 331, 346; 378/98, 98.2–98.12

See application file for complete search history.

(56) References Cited

U.S. PATENT DOCUMENTS

| 5,498,880 | A | * | 3/1996 | Lee et al. ................. 250/580 |
| 5,729,021 | A | * | 3/1998 | Brauers et al. ......... 250/370.09 |
| 5,859,463 | A | * | 1/1999 | Liu et al. ................. 257/448 |
| 6,037,609 | A | * | 3/2000 | Liu et al. ................. 257/59 |
| 6,348,693 | B1 | * | 2/2002 | Weisfield et al. ...... 250/370.11 |
| 6,665,374 | B2 | * | 12/2003 | Izumi et al. ................. 379/40 |
| 7,115,878 | B2 | * | 10/2006 | Ikeda et al. ............ 250/370.09 |
| 2001/0008271 | A1 | * | 7/2001 | Ikeda et al. ............ 250/370.09 |
| 2003/0038306 | A1 | * | 2/2003 | Izumi et al. ................. 257/222 |

* cited by examiner

*Primary Examiner*—Kiesha Rose
*Assistant Examiner*—Kiho Kim
(74) *Attorney, Agent, or Firm*—Schiff Hardin LLP

(57) ABSTRACT

In a planar radiation image detector with a number of photosensor elements arranged like a matrix, the photosensor elements being activated via at least one associated switching element and each exhibiting at least one storage element with a predetermined capacity, the storage elements are arranged above and/or below the photosensor elements. With such a planar image detector, an improved ratio of active detector surface to total detector surface is achieved.

21 Claims, 3 Drawing Sheets

PLANAR IMAGE DETECTOR

BACKGROUND OF THE INVENTION

1. Field of the Invention

The invention concerns a planar image detector for detecting a radiation image.

2. Description of the Prior Art

From EP 1 505 654 A2 a planar image detector with phototransistors is known in which the dark current is drastically reduced in comparison to conventional phototransistors. The small dark current is achieved by a gap between the source electrode and the gate electrode, or a gap between the drain electrode and the gate electrode, that causes a region of reduced field strength. The gap can be realized only with a very great deal of effort (in terms of manufacturing).

SUMMARY OF THE INVENTION

An object of the present invention is to provide a planar image detector in which the gap required for a region of reduced field strength can be achieved simply in terms of production.

This object is inventively achieved by a planar image detector having a number of photosensor elements arranged as a matrix, the photosensor elements being activated by at least one associated switching element and respectively exhibiting at least one memory element (storage element) with a predetermined capacity, with a predetermined number of phototransistors each having a gate electrode that exhibits at least one gap in the gate metallization thereof and located between the source electrode and the drain electrode.

The term "predetermined number" means that, as a lower limit, at least one phototransistor has a gate electrode with a gap and that, as an upper limit, all phototransistors of a planar image detector have a gate electrode with a gap.

By the inventive fissure arranged in the gate metallization, which fissure is also designated as a "gap" in semiconductor engineering, a simple (in terms of production), reliable and reproducible realization results of the gap required for a space of reduced field strength. A reliable value of the dark current therewith results, in particular without unwanted dark current fluctuations that have a direct influence on the image quality.

In an embodiment of the invention, memory elements are arranged above and/or below the phototransistors. A larger sensor area is thereby obtained at each phototransistor given the same pixel pitch (and therewith an overall larger detector surface), whereby the image quality is correspondingly improved.

The terms "above" and "below" are defined with regard to the incidence direction of the rays. The radiation striking the planar image detector thus first reaches the memory elements above the photosensor elements, then the photosensor elements themselves and subsequently the memory elements arranged below the photosensor elements.

The number of the phototransistors in the active detector surface can alternatively or additionally also be increased via the arrangement of the memory elements above and/or below the photosensor elements.

"Pixel pitch" means the spacing or distance between two adjacent photosensor elements measured from their center points. The smaller the pixel pitch, the sharper the image (generated from the radiation) that the planar image detector supplies.

Because the memory elements are arranged above and/or below the phototransistors, it is possible to additionally or alternatively reduce the total detector surface of the planar image detector.

The inventive planar image detector is suitable for a number of radiation types. An embodiment of the inventive planar image detector is suitable, for example, suitable for a detection of x-ray radiation. For this purpose, a radiation converter (for example, fashioned as a scintillator) is positioned in front of the phototransistors.

For example, a gadolinium sulfide doped with terbium ($Gs_2O_2S$:Tb) is suitable as a scintillator material, as is zinc cadmium sulfide doped with silver (ZnCDS:Ag) or lanthanum oxibromide doped with terbium (LaOBr:Tb) or cesium iodide doped with thallium (CsJ:Tl) or cesium iodide doped with sodium (CsJ:Na).

Short signal paths and short signal delays associated therewith are obtained according to an advantageous embodiment of the planar image detector in that the switching elements are arranged adjacent to the phototransistors.

In an embodiment, the phototransistor has a semiconductor layer on which the drain electrode and the source electrode are arranged alternating over the surface. This achieves an optimized surface utilization and therewith improved signals. It is particularly advantageous from a production viewpoint when the drain electrode and the source electrode exhibit a comb structure in plan view.

A planar image detector can be particularly simply manufactured (from a production viewpoint) in which the semiconductor layer of the phototransistor and the semiconductor layer of the switching transistor are formed of identical material. If the semiconductor layers are mounted in a common production step further advantages then result with regard to the manufacturing.

In a preferred embodiment of the planar image detector, the semiconductor layer of the switching transistor is protected from incident radiation by a light protector element. The switching states of the switching transistors are defined more clearly due to the resulting protection of the radiation-sensitive semiconductor layer. Moreover, the contrast ratio generated by the phototransistors is improved, so a sharper image is generated.

According to a further preferred embodiment of the inventive planar image detector, the phototransistor is fashioned as a thin film transistor (TFT); the semiconductor layer of the thin film transistor is composed of amorphous silicon that is applied in a low-temperature manufacturing process.

In an embodiment of the planar image detector, the memory element is composed of indium tin oxide (ITO). Since this material is particularly light-permeable, the memory element can be arranged as a large surface over the photosensor element without an impairment of the image quality.

According to a further embodiment, the drain electrode and the source electrode can also at least partially be formed of indium tin oxide (ITO).

A particularly compact design of the planar image detector is obtained is an embodiment in which the phototransistor and the switching transistor exhibit a common drain electrode.

A planar image detector in which the phototransistor and the gate electrode of the switching transistor are formed of identical material can be manufactured particularly simply from a production point of view. If the phototransistors and the gate electrodes of the switching transistors are applied in a common manufacturing step, further advantages result with regard to the manufacture.

DESCRIPTION OF THE PREFERRED EMBODIMENTS

Figure 1:
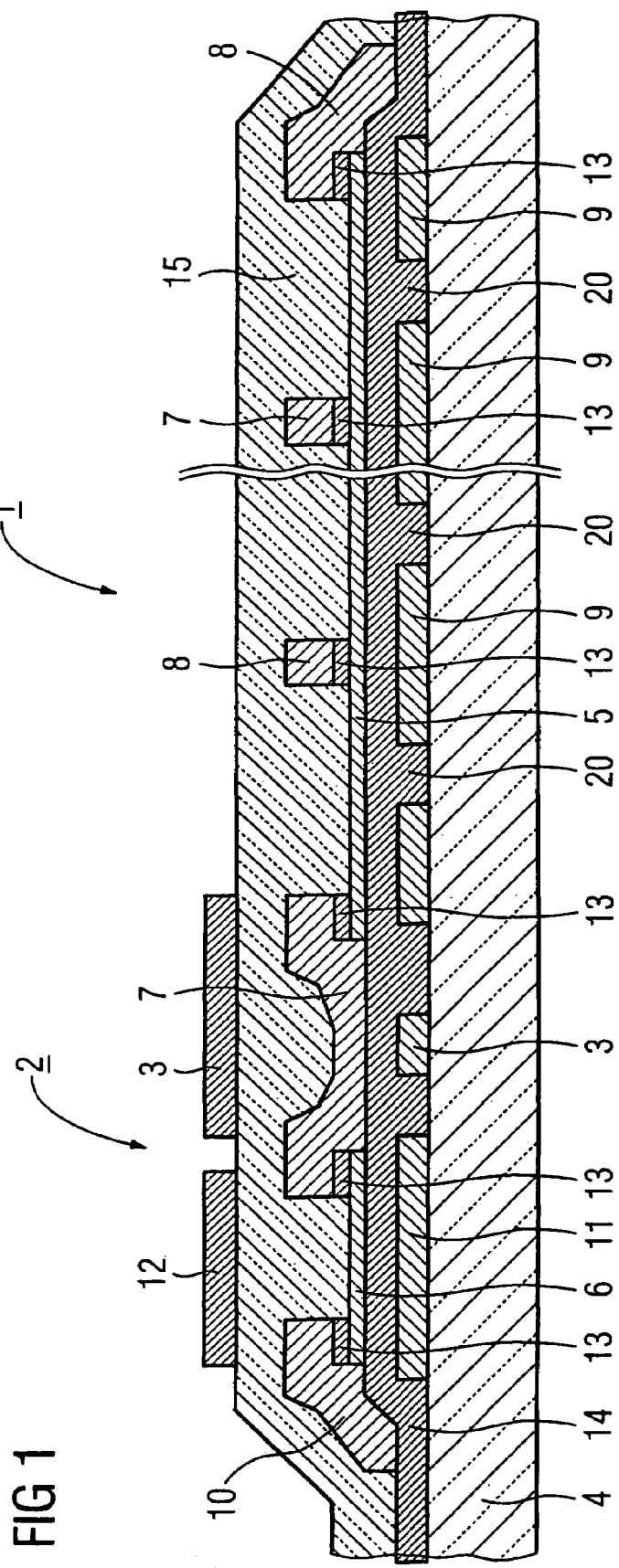
FIG. 1 is a section through a pixel of an inventive planar image detector.
Figure 2:
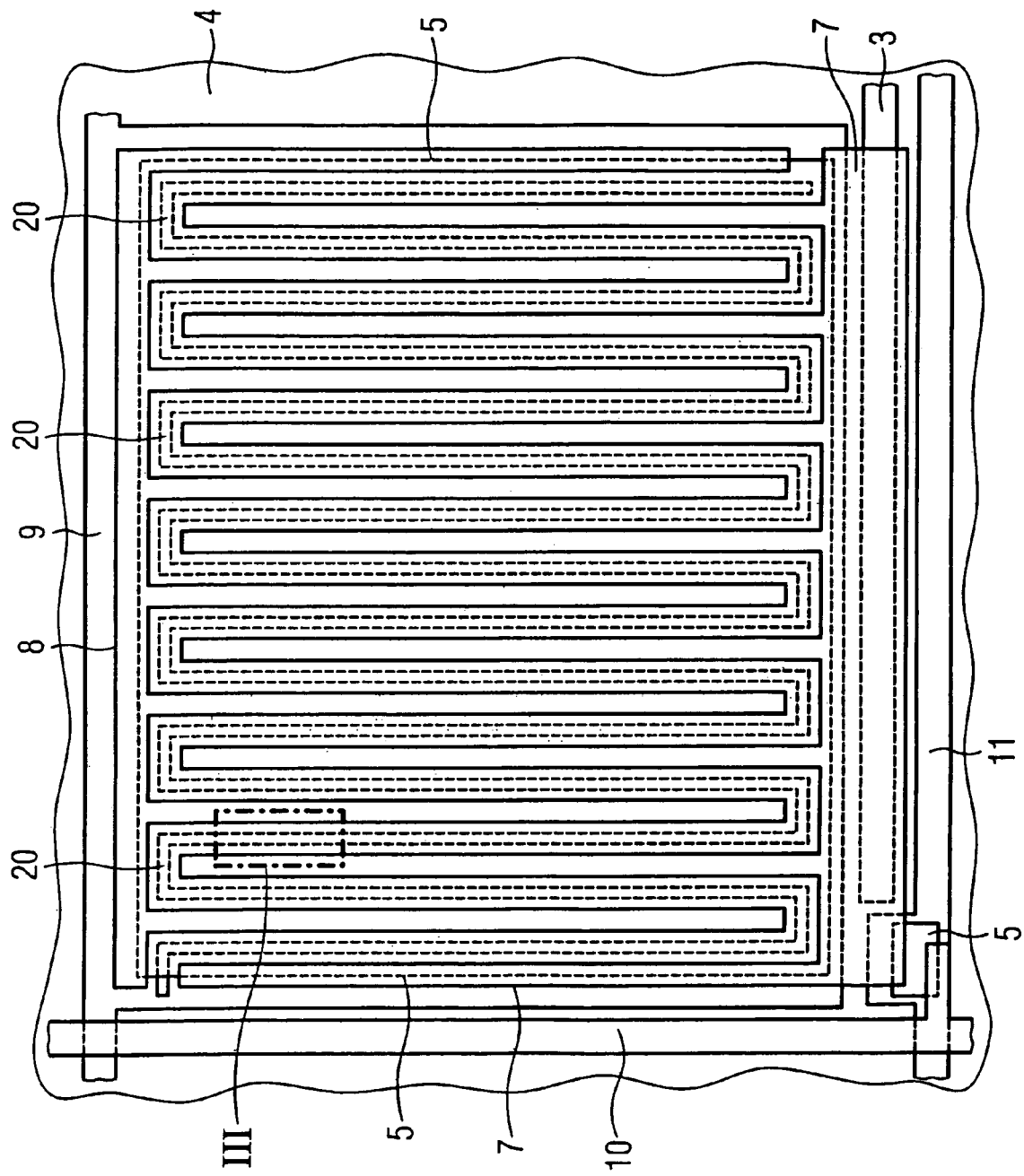
FIG. 2 is a plan view of the pixel according to FIG. 1.

A phototransistor of a planar image detector is designated with 1 in FIGS. 1 and 2. Together with a number of further phototransistors (which are not shown in FIGS. 1 and 2), the phototransistor 1 forms a planar image detector designed like a matrix.

The phototransistor 1 can be activated by at least one associated switching transistor 2 and has at least one memory element 3 with a predetermined capacity. The memory element 3 can be arranged above and/or below the phototransistor 1 and/or next to the phototransistor 1. In the shown exemplary embodiment, the memory element 3 is arranged next to the phototransistor 1.

In the shown exemplary embodiment the switching element 2 is arranged adjacent to the phototransistor 1. This achieves short signal paths and correspondingly short signal delays. The phototransistor 1 and the associated switching transistor 2 are frequently also designated as a pixel.

In the shown exemplary embodiment the phototransistor 1 and the switching transistor 2 are applied on a substrate 4 made of glass.

The phototransistor 1 is executed as a thin film transistor (TFT) with a semiconductor layer 5 made of amorphous silicon. The switching transistor 2 is likewise fashioned as a thin film transistor with a semiconductor layer 6 composed of amorphous silicon.

A drain electrode 7 and a source electrode 8 are arranged alternately over the surface on the semiconductor layer 5 of the phototransistor 1 above an n-doped layer 13. As can be seen from FIG. 2, the drain electrode 7 and the source electrode 8 considered in plan view respectively exhibit a comb structure. An optimized area utilization and therewith improved signals thus are obtained, whereby at the same time the layout is optimized with regard to production. For clarity, in FIG. 1 fewer elements of the comb-like structures of the drain electrode 7 and the source electrode 8 are shown. The n-doped layer 13 is likewise not shown in FIG. 2 for clarity.

The phototransistor 1 furthermore has a gate electrode 9 that is arranged on the substrate 4.

Figure 3:
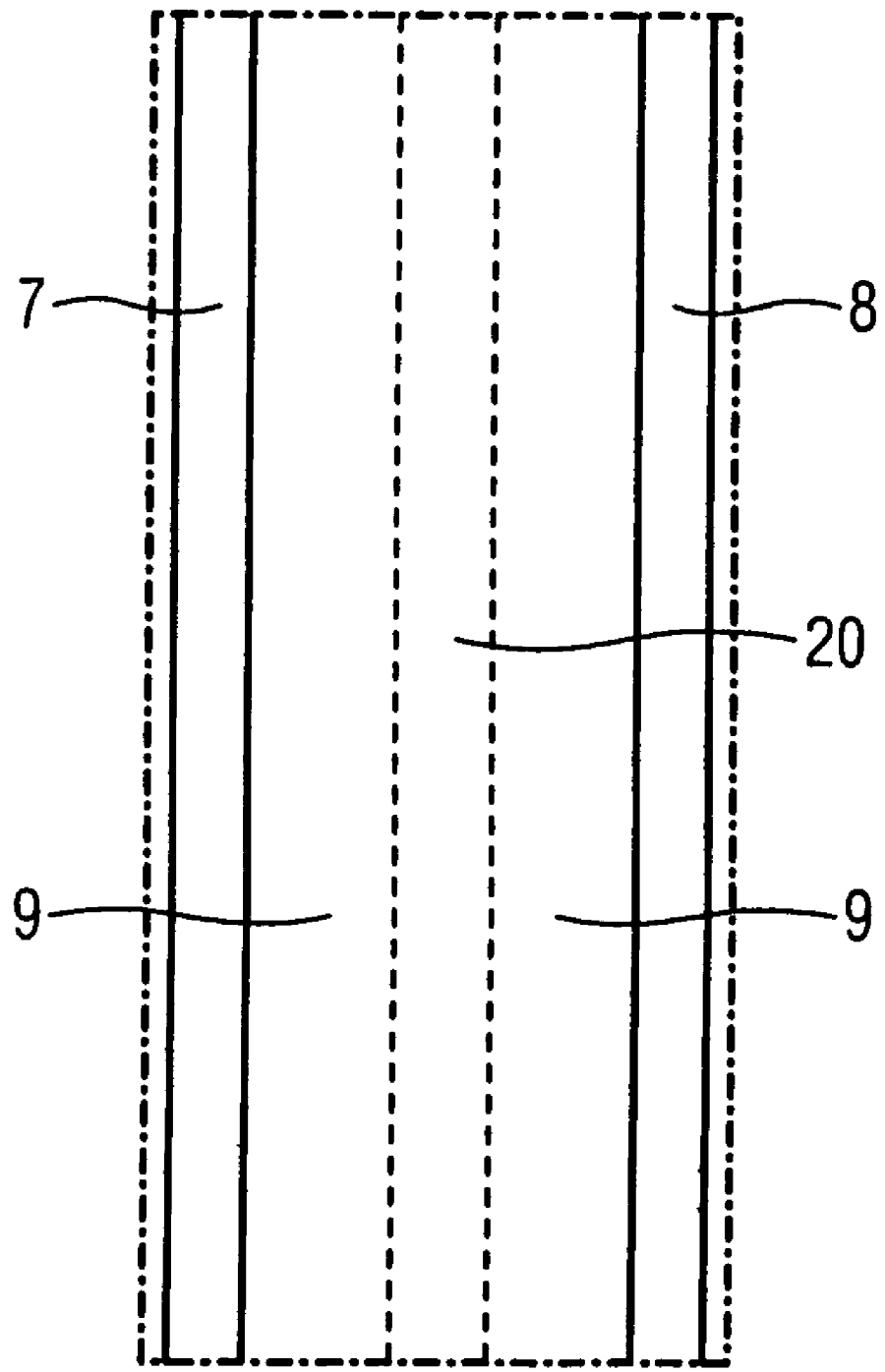
FIG. 3 is a detailed view of FIG. 2 in the region of the gap.

At least one gap 20 is provided in the metallization of the gate electrode 9. The region III in FIG. 2 is shown enlarged in FIG. 3, in which details of the gap 20 are shown.

The switching transistor 2 has a source electrode 10 and a drain electrode that is formed by the drain electrode 7 of the phototransistor 1. The phototransistor 1 and the switching transistor 2 thus exhibit a common drain electrode 7. Like the drain electrode 7, the source electrode 10 is applied over the n-doped layer 13 on the semiconductor layer 6. Furthermore, the switching transistor 2 has a gate electrode 11 that is likewise arranged on the substrate 4.

In the exemplary embodiment shown in the figures, the semiconductor layer 6 of the switching transistor is protected from incident radiation by a light protector element 12 shown in FIG. 1. The switching states of the switching transistor 2 are defined more clearly due to the resulting protection of the radiation-sensitive semiconductor layer 6. Moreover, the contrast ratio generated by the phototransistor 1 is improved, so a sharper image is generated. The passivation element 12 is not shown in FIG. 2 for clarity.

The pixel design shown in FIGS. 1 and 2 are protected by a number of passivation layers.

The gate electrodes 9 and 11 are protected by an inorganic passivation layer 14. A part of the common drain electrode 7 as well as the entire source electrode 8 of the phototransistor 1 are surrounded by an organic or inorganic passivation layer 15, whereas the other part of the common drain electrode 7 and the source electrode 10 of the switching transistor 2 is surrounded by an organic or inorganic passivation layer 16. The passivation layers 14, 15 and 16 are not in shown in FIG. 2 for clarity.

Although modifications and changes may be suggested by those skilled in the art, it is the intention of the inventors to embody within the patent warranted hereon all changes and modifications as reasonably and properly come within the scope of their contribution to the art.

We claim as our invention:

1. A planar image detector comprising:
    a plurality of phototransistors in a matrix;
    a plurality of switching elements respectively associated with the plurality of phototransistors for individually activating the respective phototransistors;
    at least one storage element with a predetermined storage capacity associated with each phototransistor; and
    a predetermined number of phototransistors in said plurality of phototransistors each comprising a gate electrode, a source electrode and a drain electrode, said gate electrode having a gate metallization with a gap therein between said source electrode and said drain electrode.

2. A planar image detector as claimed in claim 1 wherein said gap is disposed substantially centrally along said gate metallization.

3. A planar image detector as claimed in claim 1 wherein said gap exhibits a substantially uniform width along said gate metallization.

4. A planar image detector as claimed in claim 1 wherein said storage elements are disposed above and/or below said phototransistors.

5. A planar image detector as claimed in claim 1 wherein said switching elements are disposed adjacent to the respective photosensor elements.

6. A planar image detector as claimed in claim 1 wherein said plurality of switching elements is a plurality of switching transistors.

7. A planar image detector as claimed in claim 3 wherein each phototransistor and each switching transistor comprises a drain electrode and a source electrode disposed in alternation on a surface of a semiconductor layer.

8. A planar image detector as claimed in claim 4 wherein the drain electrode and the source electrode form a comb structure on said surface of said semiconductor layer.

9. A planar image detector as claimed in claim 6 wherein said phototransistors are disposed on a surface of a first semiconductor layer and said switching transistors are disposed on a surface of a second semiconductor layer, said first and second semiconductor layers being comprised of the same semiconductor material.

10. A planar image detector as claimed in claim 9 wherein said plurality of phototransistors and said plurality of switching transistors are mounted in a common production step.

11. A planar image detector as claimed in claim 9 comprising a light protector element disposed over said second semiconductor layer to protect each switching transistor from incident radiation.

12. A planar image detector as claimed in claim 6 wherein each phototransistor and associated switching transistor share a common drain electrode.

13. A planar image detector as claimed in claim 6 wherein each phototransistor has a gate electrode and each switching transistor has a gate electrode, the respective gate electrodes of each phototransistor and the switching transistor associated therewith being formed of the same material.

14. A planar image detector as claimed in claim 13 wherein the phototransistors and the gate electrodes of the switching transistors are mounted in a common production step.

15. A planar image detector as claimed in claim 6 wherein each phototransistor has a drain electrode and a source electrode and each switching transistor has a drain electrode and a source electrode, each of the drain and source electrodes of the phototransistors and the drain and source electrodes of the switching transistors being at least partially formed of indium tin oxide.

16. A planar image detector as claimed in claim 1 wherein each phototransistor is a thin film transistor.

17. A planar image detector as claimed in claim 12 wherein said thin film transistor comprises an amorphous silicon semiconductor layer.

18. A planar image detector as claimed in claim 1 wherein said storage element is comprised of indium tin oxide.

19. A planar image detector as claimed in claim 1 comprising a radiation converter disposed above said plurality of photosensor elements.

20. A planar image detector as claimed in claim 19 wherein said radiation converter is a scintillator.

21. An x-ray detector as claimed in claim 20 wherein said scintillator is comprised of scintillator material selected from the group consisting of gadolinium sulfide doped with terbium, zinc cambium sulfide doped with silver, lanthanum oxibromide doped with terbium, cesium iodide doped with thallium, and cesium iodide doped with sodium.

* * * * *